United States Patent [19]
Chawla et al.

[11] Patent Number: 5,537,080
[45] Date of Patent: Jul. 16, 1996

[54] GAIN STABILITY ARRANGEMENT FOR HV MOSFET POWER AMPLIFIER

[76] Inventors: Yogendra K. Chawla, 19 Chelsea Park, Pittsford, N.Y. 14534; Bradford J. Lyndaker, 203 Meigs St., Rochester, N.Y. 14607

[21] Appl. No.: 466,347

[22] Filed: Jun. 6, 1995

[51] Int. Cl.$^6$ .............................. H03F 3/26; H03F 1/30
[52] U.S. Cl. ................... 330/266; 330/269; 330/285; 330/289
[58] Field of Search ................................ 330/133, 134, 330/264, 266, 269, 279, 285, 289, 295

[56] References Cited

U.S. PATENT DOCUMENTS

| | | | |
|---|---|---|---|
| 4,924,191 | 5/1990 | Erb et al. | 330/289 X |
| 5,477,188 | 12/1995 | Chawla et al. | 330/269 |

*Primary Examiner*—James B. Mullins
*Attorney, Agent, or Firm*—Trapani & Molldrem

[57] ABSTRACT

A high power radio frequency amplifier employs a power stage in which a bank of push-pull stages are connected in parallel. These power stages employ relatively low-cost high voltage MOSFETs. Because the devices are operated in their active regions, these MOSFETs are susceptible to drops in gain during operation due to heating of the transistor die. The gain fluctuation has a first, slower component that varies over a time of several minutes, and a second, faster component that varies over a span of seconds. The amplifier has B+ or drain voltage control to compensate for short-term (minutes) gain degradation and preamplifier gate voltage control to compensate for short-term (seconds) gain degradation.

7 Claims, 5 Drawing Sheets

GAIN STABILITY ARRANGEMENT FOR HV MOSFET POWER AMPLIFIER

BACKGROUND OF THE INVENTION

This invention relates to power amplifiers and is more particularly directed to pulsed RF power amplifiers of the type in which several FETs or other amplifying devices are combined together to amplify an RF input signal. The invention is more specifically directed to a technique of controlling the bias levels of the amplifying devices so that the system gain is held constant despite increases in transistor die temperature.

Recently some circuit designers have begun to consider high voltage MOSFETs for use in power amplifiers as a means to reduce cost and size of the amplifier. These FETs, which are more commonly employed in switching power supplies, have a much more abrupt gate voltage to drain current characteristic than the RF power MOSFET. This makes a simple thermal compensation scheme difficult and costly to implement. These low cost FETs are also very sensitive to thermal variations, which can cause thermal runaway. If this sensitivity is not addressed adequately, destruction of the device can result. That is, threshold voltage change because of temperature change is a serious problem. The fact that the gate voltage to drain current characteristic is steeper and more abrupt as compared with RF power MOSFETs results in a faster, more extreme thermal runaway.

Additional problems arise where the high voltage MOSFETs are employed in a linear RF pulse power amplifier for low-band (5 to 25 MHz) magnetic resonance imaging (MRI). When these FETs are used, not only is it necessary to select an appropriate high voltage MOSFET, but care must be exercised in design of the push-pull circuitry for each pair of transistors. Thermal compensation of gate bias is needed to achieve dynamic linearity and gain stability. Thermal control of B+ supply, i.e. drain voltage, is required to achieve gain stability, and the cooling system must be optimally designed for management of heat, i.e., to cool the transistors evenly with highly efficient heat transfer.

The linear RF amplifier has to be designed so that each push-pull transistor pair amplifies evenly over the entire low band (5–15 MHz) with a high flatness characteristic around each given imaging frequency. The dynamic linearity must be maintained as high as possible over a wide range of pulse widths and duty cycles. That is, the output power to gain response over the specified dynamic range (40 dB) should be within a ±1.0 dB window.

Gain stability is defined as the variation of gain (for both long term and short term) at a specified peak RF output level. Gain stability should be maintained at ±0.2 dB for 15 minutes of operation, and at ±1.0 dB for 5000 hours of operation.

Phase stability is defined as variation of phase over the specified dynamic range and over time at a specific power level. The phase stability should be between ±2° and ±5°, for short and long term, respectively.

Pulse droop is defined as the variation of peak RF output power over the pulse width for a specific output and duty cycle. Pulse droop should be within ±0.2 dB.

Pulse rise and fall times should be less than 25 μsec, measured between the 10% and 90% levels of RF output.

The gated-on noise figure should be less than 27 dB for the overall system. This corresponds to less than −80 dBm/Hz gated-on output noise floor.

The gated-off noise figure should be no greater than 20 dB for the overall system, for a gated-off noise floor of less than −154 dBm/Hz.

The amplifier must be able to deliver the minimum specified power level into a variety of voltage standing wave ratio loads, or VSWRs. The amplifier must have a maximum output power capability into mismatched loads, so as to be useful for initial MRI system calibration.

At the present time, solid-state amplifiers utilize RF power MOSFETs which are designed and characterized for linear RF applications. The highest design operating frequency is less than the transistor's specified maximum frequency. The transistor's internal capacitances, $C_{ISS}$, $C_{RSS}$ and $C_{OSS}$ are all low and have negligible effect on the overall source and load impedances. The RF power MOSFETs typically operate at 50 volts drain to source, and a pair in push-pull can provide peak output power of 400 watts, with a power gain of 13 dB. A typical MRI application requiring five kilowatts of peak RF power needs sixteen push-pull pairs.

On the other hand, high voltage MOSFETs, having a 400 volt breakdown characteristic and a 310 watt average dissipation capacity, can be operated at a nominal 85 volts drain to source, with a 10 dB power gain and 900 watts peak output power. This means that only eight push-pull pairs are needed to achieve a total peak output power of five kilowatts with a sufficient voltage breakdown margin to operate into high VSWRs. The high voltage MOSFET has greater than a 4:1 drain to source breakdown margin for 85 volts drain voltage to avoid voltage breakdown. Meanwhile, the RF input drive power level is kept the same as for the rated output regardless of load mismatch.

Therefore, because of the higher power and impedance mismatch capability of the high voltage MOSFETs, and also because of the lower cost of these than the RF power MOSFETs, any power amplifier that implements the high voltage MOSFETs would be extremely attractive.

Because of gain stability and dynamic linearity problems, however, these transistors cannot simply be substituted in place of the RF power MOSFETs. Instead, problems of drain bias stability, gain stability, and dynamic linearity must be taken into account. Means for dealing with these issues have not been addressed in the prior RF amplifier arts, even through the problems presented are by no means trivial.

Some of these problems have been addressed in commonly-assigned U.S. Pat. Appln. Ser. No. 08/275,124, now U.S. Pat. No. 5,477,188. The technique described therein is effective for intermediate term gain drift, but has been unable to respond to short term gain drifts.

OBJECTS AND SUMMARY OF THE INVENTION

It is an object of this invention to provide a reliable but low cost RF amplifier which delivers RF at high power and avoids the drawbacks of the prior art.

It is a more specific object of this invention to provide drain bias control and drain supply control to maintain the transistor in the active range, so as to achieve linear amplification with good stability, for various pulse widths and duty cycles over a wide range of temperatures.

It is a more particular object to provide drain bias control which is independent of the mode of operation of the amplifier or of the RF frequency involved.

It is a further object to provide a gain stability and dynamic linearity feature for the RF power amplifier which is simple and inexpensive to implement.

It is a more specific object to provide both intermediate term, i.e., short-term (minutes) gain compensation and short term (seconds) gain compensation so as to account for both moderate and short term heating effects in the transistor die.

In accordance with an aspect of the present invention, the RF power amplifier stage contains a number of parallel push-pull RF power amplifier circuits. Each of these amplifier circuits comprises a first and a second high voltage MOSFET with the drains coupled to a source of drain voltage, e.g. a nominal 85 volts. An RF input signal is applied, from an upstream stage to an input terminal. In practice, the outputs of a number of push-pull amplifiers are coupled to a combiner network to produce the required high power. In a preferred embodiment a reversing transformer is employed between the drains of the FETs and the supply of drain voltage.

When operated in the full-on and cut-off modes, high voltage MOSFETs produce minimal heat due to dissipation. In continuous operation, each FET can dissipate an average of 310 watts. In pulse operation, each FET has a dissipation capability of 1250 watts peak for a pulse width of 6 milliseconds and a duty cycle of 10%, or 1786 watts peak for a pulse width of 3 milliseconds and a duty cycle of 5%. The heat produced should flow as evenly as possible to a heat sink to keep the FETs operating within their thermal limits. The circuit design should keep the FET junction temperature below 115° C. to provide a margin for acceptable transistor life time, well below the 150° C. maximum junction temperature. For the FETs employed in one embodiment, the average thermal impedance from junction to case is about 0.4° C. per watts, and the thermal impedance for pulsed operation is much lower. The thermal impedance for 3 ms pulse width and 5% duty cycle is 0.07° C. per watt. For 6 ms pulse width and 10% duty cycle, thermal impedance is 0.1° C. per watt. To maintain dynamic linearity within a ±1.0 dB window, the drain bias should be 250 mA. The gate to source threshold voltage should be between 2.7 and 4.7 volts.

These transistors have a typical gate-source voltage shift of ±5 mV per degree Celsius. The gate-source threshold shift over 25° C.—75° C.—25° C. temperature cycle should also be less than ±5 mV.

The drain-source on-resistance $R_{DS-ON}$ is about 0.20 ohm which determines the drain efficiency and output power capability. The resistance $R_{DS-ON}$ increases with die temperature which lowers the available drain-source voltage, thus affecting gain stability. This can typically involve a 40% increase in $R_{DS-ON}$ for a temperature rise of 25° to 75° C.

The gate-source threshold decreases with temperature, thereby increasing drain bias current for a given gate-source bias voltage. This affects both gain stability and dynamic linearity. Proper drain bias current is determined empirically for optimal dynamic linearity. The control of drain current determine the dynamic linearity and gain stability of the amplifier. The shift over time in gate-source voltage determines the drain bias current stability limit. This can be stabilized using thermal feedback control.

Transistor forward transconductance $G_{fs}$ is typically 9.5 to 13.5 Siemens, for a drain current often amperes. For lower current levels, e.g., 250 mA, forward transconductance $G_{fs}$ is 1.2–2.2 Siemens.

Forward transconductance determines the power gain and drain bias, which affects both dynamic linearity and amplifier gain.

Dynamic capacitances of the FETs also affect the gain and gain stability. Input Capacitance ($C_{ISS}$) can typically be up to 1950 pf. This determines the RF gain capability of the amplifier, and the highest useful frequency (assuming 8 dB minimum gain). Reverse transfer capacitance ($C_{RSS}$) can be up to 310 pf. This determines the RF stability of the amplifier and its capability to operate into high VSWR loads. Output capacitance ($C_{OSS}$) can be up to about 750 pf. This determines the drain efficiency and output power capability of the amplifier, and the usable highest frequency (assuming 50% minimum drain efficiency).

In order to control temperature of the FETs and manage the heat flow, the first and second transistors of each push-pull pair are mounted on a copper spreader plate which is part of the heat sink. An aluminum or fiberglass strap can be mounted onto the spreader plate sandwiching the transistors between the strap and the plate. Each transistor has a copper base that permits transfer of heat from the active semiconductor region, or die, to the spreader plate. The strap is positioned to press against the die regions so that heat is transferred efficiently down into the heat sink. A thermal sensor device e.g., a tempistor is mounted on the spreader plate between the two transistors, and outputs a signal that varies as a function of temperature. This is coupled to bias control stabilization circuitry to adjust the gate bias voltage and/or to vary the drain voltage to maintain gain stability and dynamic linearity.

The RF power amplifier includes a gain stability compensation circuit that adjusts the drain supply voltage ($V_{dd}$) in response to changes in the die temperature of the transistors. The gain stability compensation circuit can include means for measuring ambient inlet air and the transistors by measuring heat sink temperature. The gain stability circuit can further include a power integration circuit to generate an integration signal that represents a time integral of the amplifier output power. This signal is combined with the difference signal to produce a reference signal that is fed to control the drain supply voltage. This compensates for slow changes in FET gain, i.e. on the order of minutes. A power integration circuit provides a running integral of output power over a short time interval, and supplies this running integral to a bias circuit to control the gate bias of a Class A preamplifier in advance of the power amplifier stages. This compensates for short term (seconds) gain loss due to die heating. These gain control measures combine to ensure that the total power amplifier output gain is flat over time.

The above and many other objects, features, and advantages of this invention will become apparent from the ensuing description of a Preferred Embodiment, which should be read in connection with the accompanying Drawing.

DETAILED DESCRIPTION OF THE PREFERRED EMBODIMENT

Figure 1:
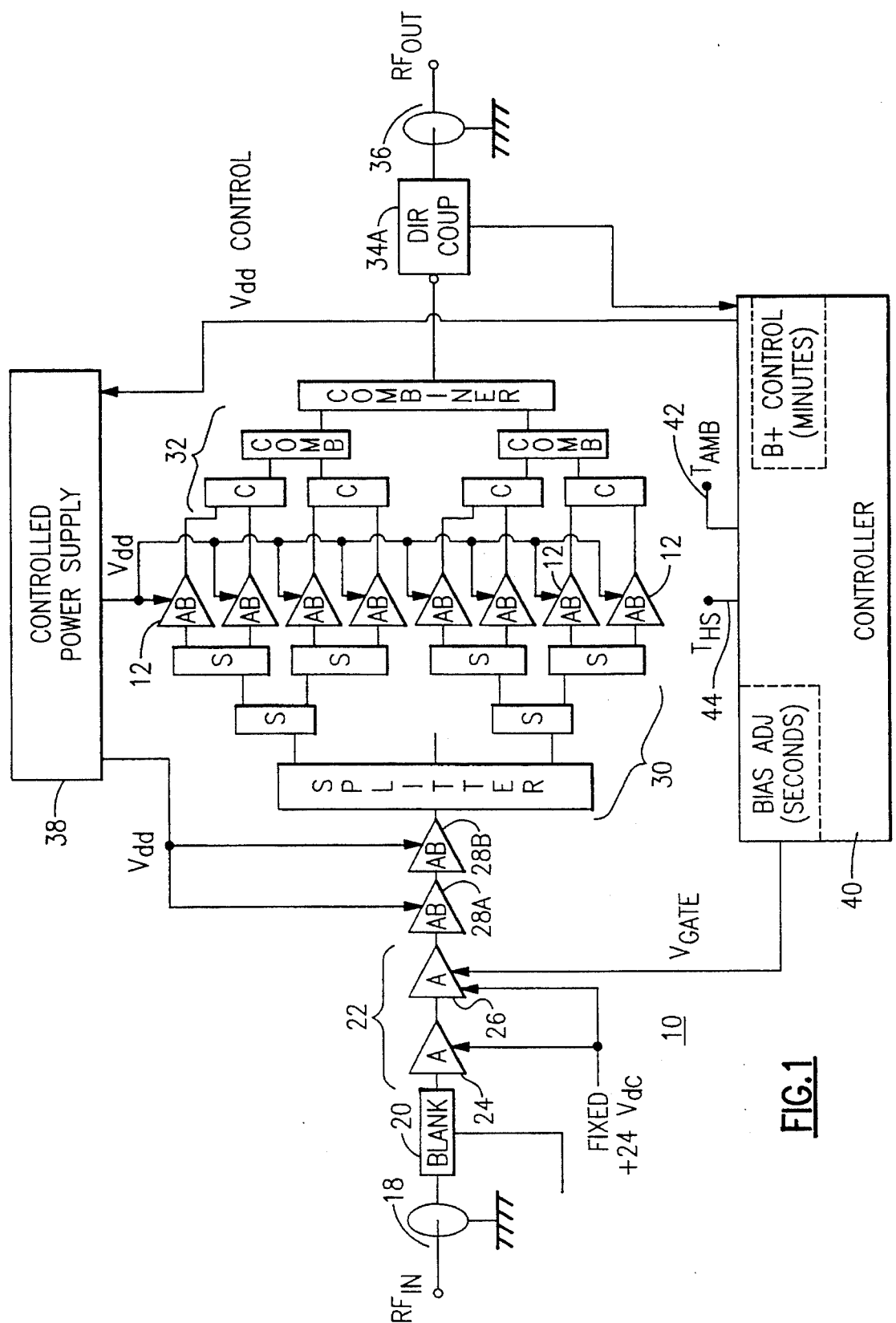
FIG. 1 is a block diagram of an RF power amplifier according to one preferred embodiment of this invention.

With reference to the Drawing, and initially to FIG. 1, a high-frequency power amplifier arrangement 10 to be employed in Magnetic Resonance Imaging (MRI) must be extremely stable. This stability is paramount to the operation of the entire MRI system. Any instability with respect to gain or phase associated with the RF amplifier will adversely affect the quality of images generated by the MRI system.

Figure 2:
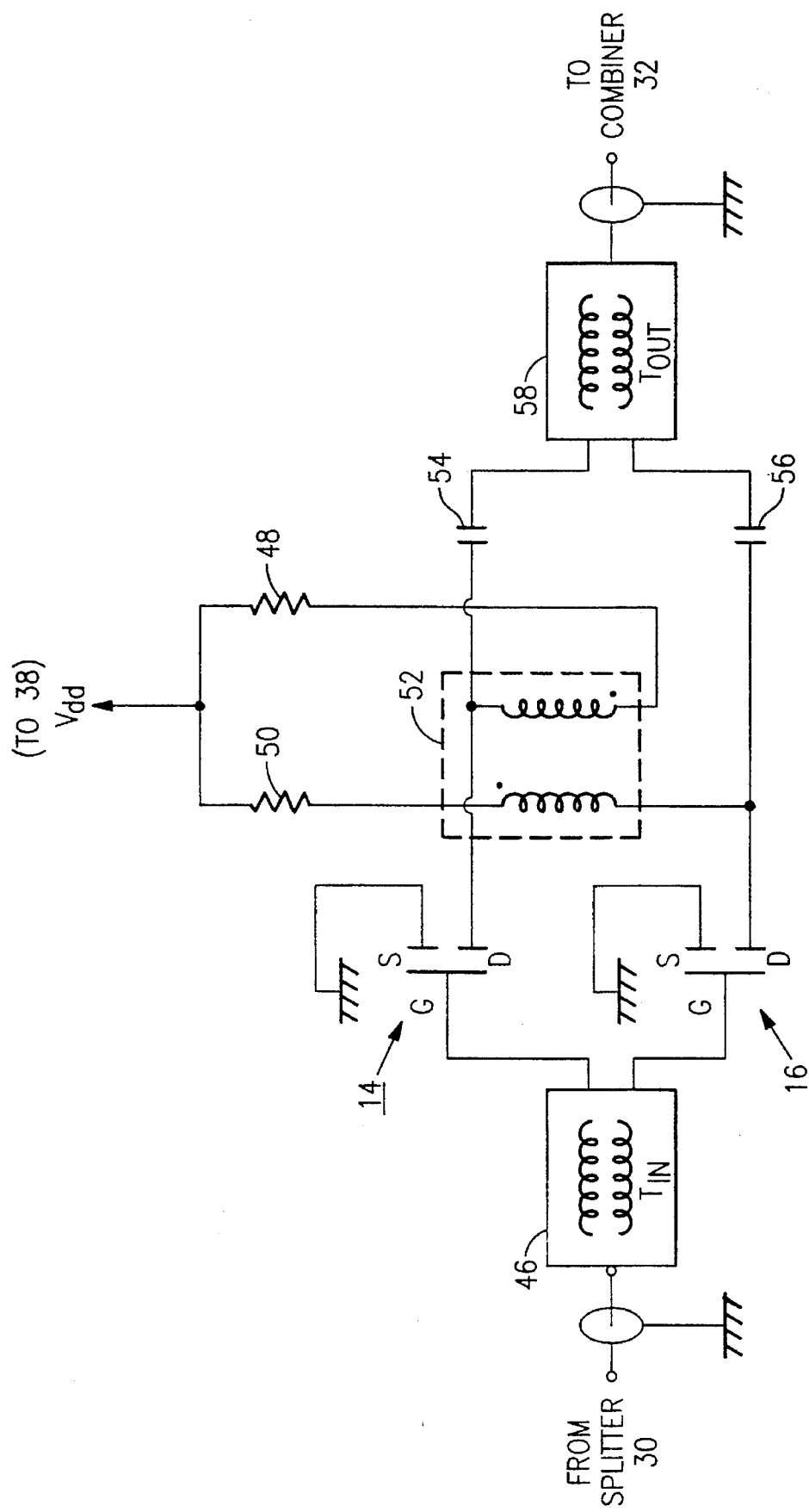
FIG. 2 is a simplified schematic diagram of a push-pull power amplifier stage employing a pair of high-power MOSFET transistors.

The design for the amplifier 10 incorporates a bank of paralleled push-pull amplifier stages 12, each of which employs a pair of high voltage MOSFETs 14, 16, as shown in FIG. 2. These MOSFET devices 14, 16 have an epitaxial layer thickness and die area which is larger than that of standard RF power MOSFETs that are conventionally used for MRI applications. The reason for the larger epitaxial layer thickness is due to the ability of this device to withstand peak drain-source voltages (breakdown voltage $BV_{dss}$) of more than three (3) times that of a conventional RF power MOSFET. The reason for the larger die area is because the device needs to be able to handle nearly twice the current (maximum continuous current $I_D$) of the RF MOSFET device. Along with a higher continuous current rating, a high voltage MOSFET can withstand peak currents of as much as four (4) times their continuous current rating. The maximum average power ratings for both RF and high voltage MOSFETs in this application are about equal.

The conventional RF MOSFET is designed to be extremely linear in operation throughout its dynamic range of transmitted power. In addition to this, the RF MOSFET is designed to be very stable, both in terms of RF gain stability and phase stability.

The high voltage MOSFETs, while exhibiting a high degree of phase stability, are not so linear in operation over their dynamic range as the RF MOSFETs, but acceptable linearity can be achieved by overall circuit design. However, with respect to their performance in terms of gain stability, the high voltage MOSFETs have not been found to perform nearly as well as RF MOSFETs.

In the present embodiment, the high voltage MOSFETs 14, 16 are operated in a class AB push-pull configuration. Bias is maintained by use of technology outlined in the commonly-assigned copending U.S. patent application Ser. No. 08/275,124, now U.S. Pat. No. 5,477,188. Using that technique, quiescent bias current of 250 mA is maintained through the devices. In original operation the drain supply (B+) or drain voltage ($V_{dd}$) can be maintained at 85 volts, using a conventional linear voltage regulation technique.

In typical MRI amplifier operation, the devices are biased and transmit power in pulse mode, with a duty cycle of about 5%. RF efficiency for devices operating in Class AB mode can be assumed to be about 50%. Each device is responsible for producing approximately 400 watts of power. From this information, device dissipation can be calculated as:

|   | Bias: | 250 mA × 85 VDC × 0.05 | 1.06 W |
|---|---|---|---|
| + | RF: | 400 W × 0.05 | 20.0 W |
|   | Total: |  | 21.06 W |

This device power is dissipated in the form of heat, transferred from the junction of the device die to the flange, and then to the associated heat sink. This heat is the root cause of the gain reduction over time. It turns out that drain-source resistance $R_{DS(ON)}$ increases with device junction temperature ($T_J$). By consulting data sheets for the MOSFET devices used, it can be found that for each degree Celsius increase in junction temperature $T_J$ there is an increase of approximately two milliohms 0.002Ω in drain-source resistance $R_{DS(ON)}$. During operation at system maximum output power, there is an increase of about 75° C. in junction temperature $T_J$. This increase accounts for a 75% increase in drain-source resistance $R_{DS(ON)}$.

The increase in drain-source resistance $R_{DS(ON)}$ causes a gain reduction due to the following phenomenon. As the drain-source resistance $R_{DS(ON)}$ of the device increases, more supply voltage is dropped across the device, leaving less usable voltage available for RF power amplification. This decrease in usable supply voltage (B+ or $V_{dd}$) causes the output amplitude of the amplified signal to decrease over time.

All field effect transistors (FETs) experience some increase in drain-source resistance $R_{DS(ON)}$ due to an increase in junction temperature $T_J$. FETs for use in radio-frequency applications are designed to be very stable over some operating temperature range both in terms of their drain-source resistance $R_{DS(ON)}$ and in terms of their overall gain characteristic. Simple thermal feedback systems work well to correct for small increases in drain-source resistance, resulting in small decreases in gain encountered due to increases in operating junction temperature $T_J$. FETs that are designed for use in high voltage applications experience a much greater fluctuation in drain-source resistance $R_{DS(ON)}$ and in gain, due to junction temperature increases. This increased instability makes simple temperature feedback systems rather ineffective when used with high voltage FETs.

High voltage MOSFET devices have more conventionally been used in switching power supply applications. In this type of environment, the devices are operated as a switch, with operation only in the hard-on state and the hard-off state. In the first state, the MOSFET is biased well into its saturation region. In this condition, maximum current passes through the source-drain path, but only a minimal voltage is dropped across the device. Consequently, the MOSFET does not consume significant power in this state. In the second state, maximum voltage drop appears across the source-drain path, but practically no drain current flows, so very little power is consumed. The typical application in which high voltage MOSFETs are used is a switch mode power supply, where these devices normally operate in a closed-loop and the amount of power delivered is regulated on a constant, real-time basis.

In RF applications, however, an entirely different operation scheme exists. The devices are operated within their active region along a very sharp transfer curve of gate voltage to drain current. As mentioned above, control of drain current can be accomplished using technology such as that outlined in co-pending U.S. pat. Appln. Ser. No. 08/275,124, now U.S. Pat. No. 5,477,188. Because of the requirement for pulsed operation, the amplifier itself has to operate under pulsed conditions, and closed loop control of gain becomes impractical, requiring envelope feedback which limits pulse sequencing capability.

Returning now to FIG. 1, an RF power amplifier 10 comprises, in sequence, an RF input 18, a blanking circuit 20 that attenuates the input signal at blanking intervals, a preamplifier stage 22, here formed of a first, fixed-bias Class A amplifier 24, a second, controlled bias Class A amplifier 26, and a third Class AB amplifier 28A, followed by a fourth Class AB stage 28B. Following the preamplifier stage is a series of signal splitters 30 arranged in cascade to supply the bank of Class AB push-pull amplifiers 12. These amplifiers 12 can be seen in more detail in FIG. 2. Following the power amplifiers 12 is a series of combiners 32, arranged in cascade, providing a combined amplified output through a directional coupler 34A to an RF output 36. A controlled power supply 38 provides a nominal 85 volts dc as drain supply voltage. Drain current is measured for each of the amplifiers 12, and a measurement of the drain current is supplied to an input of a control circuit 40. Total system power output is measured at the directional coupler 34A, and this measurement is also supplied to the control circuit 40. The control circuit 40 in turn regulates the controlled power supply 38 to control the drain voltage $V_{dd}$ and also regulates the gate bias voltage supplied to the Class A amplifier 26 of the preamplifier stage 22. Also coupled to the control circuit are an ambient air temperature sensor 42, physically positioned inside the equipment cabinet of the amplifier assembly, which provides the control circuit 40 with a signal that represents the ambient temperature $T_{AMB}$. Another temperature sensor 44 positioned on the equipment heat sink provides a signal representing the heat sink temperature $T_{HTSK}$. This signal is also fed to the control circuit 40. The details of the circuitry described thus far are discussed in greater detail in copending appln. Ser. No. 08/275,124, now U.S. Pat. No. 5,477,188.

The circuitry for each push-pull power amplifier 12 is represented rather schematically in FIG. 2. The amplifier 12 is shown in a less abbreviated form in copending appln. Ser. No. 08/275,124, now U.S. Pat. No. 5,477,188. Each amplifier incorporates the pair of high voltage MOSFETs 14, 16, connected in push-pull (i.e. 180 degrees out of phase). The high voltage MOSFETs 14, 16 are operated at a nominal 85 volts $V_{dd}$, and each push-pull pair puts out greater than 900 watts of peak RF output power over a 5 to 25 MHz frequency range. The transistors 14, 16 are high voltage MOSFETs selected for the characteristics described earlier. An input transformer 46 couples the gates of these MOSFETs 14, 16 to the associated output of the splitters 30, and the respective source electrodes are coupled to ground. Drain voltage $V_{dd}$ is applied from the power supply 38 through respective drain resistors 48 and 50, and through respective windings of a reversing transformer 52, to the drain electrodes of the respective MOSFETs 14, 16. The drain electrodes are AC coupled through capacitors 54 and 56, respectively to inputs of an output transformer 58, which provides an amplified output signal to an associated input of the combiners 32. Not shown in FIG. 2 are biasing resistors to adjust gate bias and various other elements. These details are discussed in the copending appln. Ser. No. 08/275,124, now U.S. Pat. No. 5,477,188.

In an RF high power amplifier of this type, it is only possible to control the gain via closed-loop method by knowing the exact shape of pulse expected to be produced by the amplifier. This shape is determined by the modulating pulse present at the input of the unit. Pulse distortion cannot be tolerated, as it will produce unacceptable distortions in the MRI imaging system. A control system bandwidth of 50 KHz is required for this. Although a control system with this bandwidth is achievable, the pulse distortion resulting from classic control problems of overshoot and ring goes unresolved.

The present invention offers an alternative to closed loop gain control for use with pulse mode MRI applications.

RF gain stability is a critical design factor for amplifiers used for MRI applications. The specific RF gain stability desired can be stated as short term gain stability (in terms of minutes) and acceptable stability levels are as follows:

| | |
|---|---|
| 5 Minutes | ±0.2 dB |
| 15 Minutes | ±0.4 dB |
| 60 Minutes | ±1.0 dB |

Figure 3:
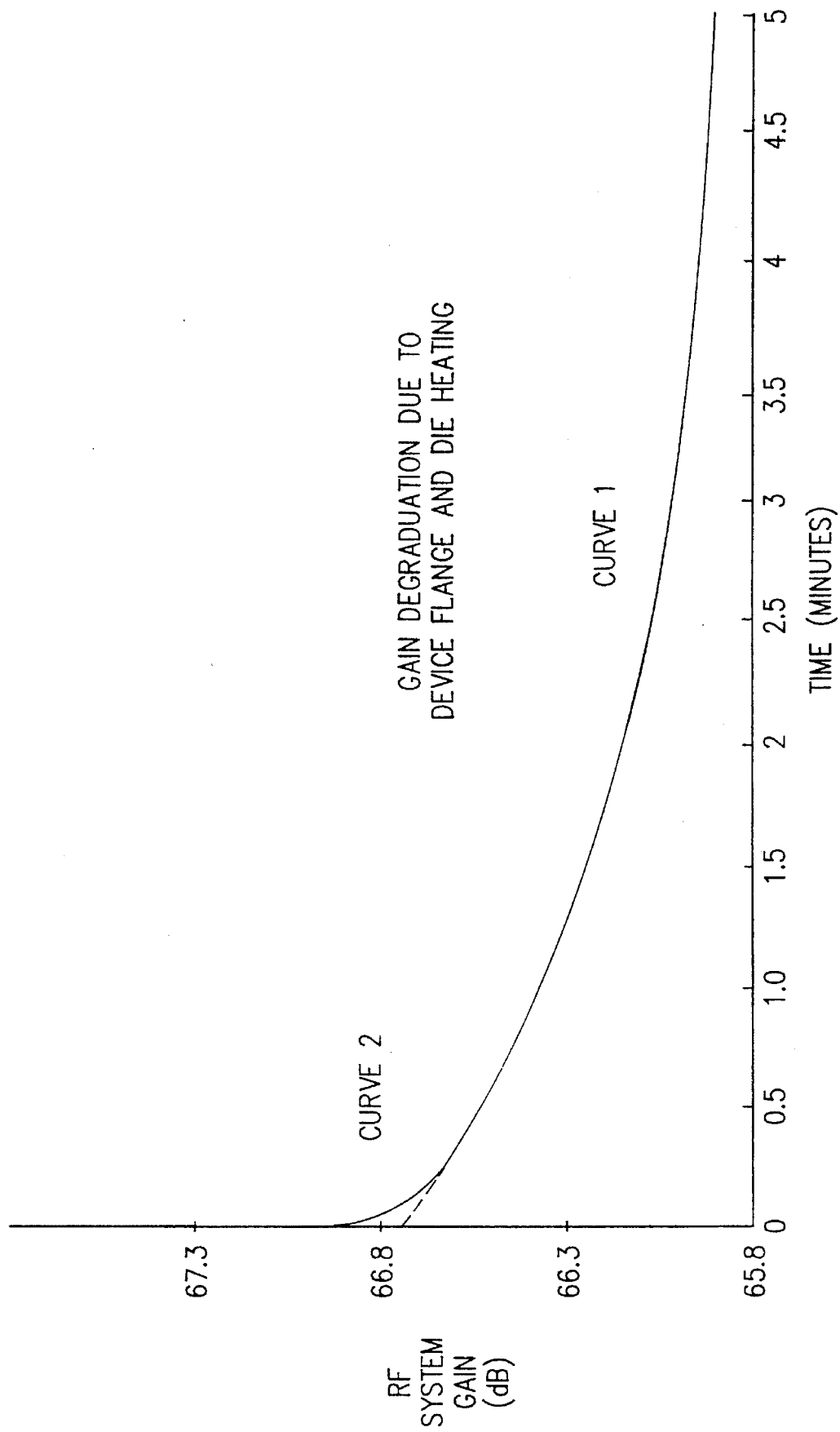
FIG. 3 is a typical curve showing drift of amplifier gain over time due to device junction heating.

Gain drift that is associated with the use of high voltage MOSFET devices operated in open loop mode can vary from one application to another, and can vary with transistor die size and device dissipation. The gain drift that has been encountered in the specific application of amplifying a radio-frequency pulse for magnetic resonance imaging is expressed graphically in the chart of FIG. 3.

It is apparent from the graph that there are two distinct curves associated with gain stability. A more gradual downward drift of gain (Curve 1) is caused by the slow heat transfer from the device die to its flange, and then to the heat sink that the high voltage MOSFET is attached to. The rather sharp spike that is superimposed upon Curve 1 near the ordinate represents a fast acting gain drift, and is shown here as Curve 2. The downward drift of Curve 1 can be considered to proceed along the dash line from time zero, and then dominates the gain degradation after some several seconds. The gain continues to diminish over some minutes, and stabilizes at some time after about five minutes in this example. This gradual downward drift will be called short term (minutes) gain drift. The method for correction of this drift is accomplished by a so-called B+ correction for gain stability. That method is described in co-pending U.S. Pat. Appln. Ser. No. 08/275,124, now U.S. Pat. No. 5,477,188, which is incorporated herein by reference.

In the above-mentioned technique, by artificially increasing the amount of usable drain supply voltage $V_{dd}$ or B+, it was possible to cancel out the short term (minutes) gain drift and provide a flat, stable gain. However, that technique did not eliminate the other gain drift as characterized in Curve 2 of FIG. 3. It was to address that problem that the present invention was developed.

After careful consideration, it was determined that there were two major factors at play in causing the downward drift of gain in the system. These two factors are as follows:

1. Device Flange Temperature and
2. System Power Transmission.

These two factors, although not difficult to measure, do require explanation of the method used to obtain their respective magnitudes.

Device flange temperature is easily obtained by measuring the temperature of the heat sink to which the device is mounted. This is especially true when a good thermal interface is maintained between the device and a thermally conductive heat sink, for example made of copper. A temperature sensor, such as the temperature sensor 44, positioned in close proximity to the MOSFET device 14 or 16, provides an accurate means of measuring the heat sink or flange temperature. It is also important to know the temperature of the flange relative to its starting or ambient temperature. A measurement of the ambient air entering the unit for cooling can be made at or near the heat sink cooling air inlet, for example using the temperature sensor 42. The difference between the two temperatures can be calculated by a microprocessor (or with suitable linear hardware) produce a result that represents the amount of rise in flange temperature over operation time.

System power transmission is also measured. This quantity can be provided from the directional coupler 34A (FIG. 1), located at the RF output of the amplifier 10. The directional coupler acts as an integral power measuring circuit, and provides a value that can be read as a scaled voltage by a microprocessor, or can be fed to an equivalent linear circuit.

Figure 4:
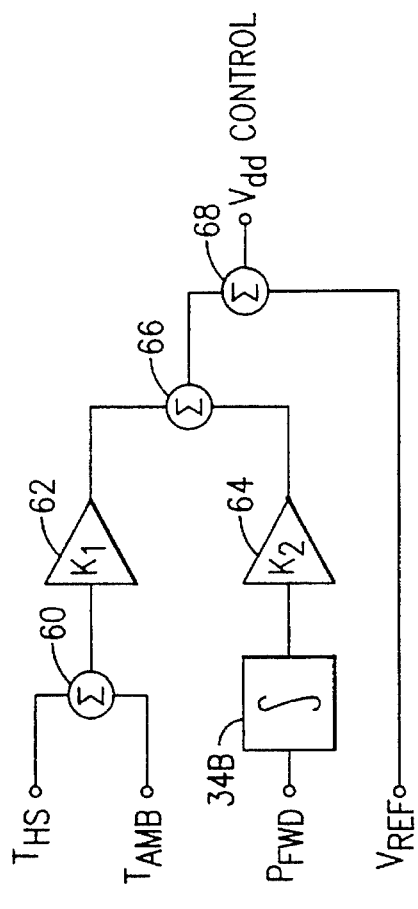
FIG. 4 is a simplified schematic diagram of gain control circuitry for correcting intermediate term, i.e., short term (minutes) gain degradation.

A schematic block diagram of circuitry to compensate for the short term (minutes) gain drift is shown in FIG. 4. Here, $V_{dd}$ represents the corrected drain supply voltage that is fed to the MOSFETs 14 and 16, $V_{Ref}$ represents the initial or idle drain or supply voltage for the MOSFETs, $K_1$ is a scaling factor for temperature effects on gain stability, $T_{HTSK}$ represents the device heat sink or flange temperature, $T_{AMB}$ is the ambient or start temperature, $K_2$ is a scaling factor for output or transmitted power, and $P_{FWD}$ is the system output power. The correction caused by these parameters can be expressed in simple form as follows:

$$V_{dd} = V_{Ref} + [K_1(T_{HTSK} - T_{AMB}) + K_2(\int P_{FWD}(t)dt)]$$

Figure 5:
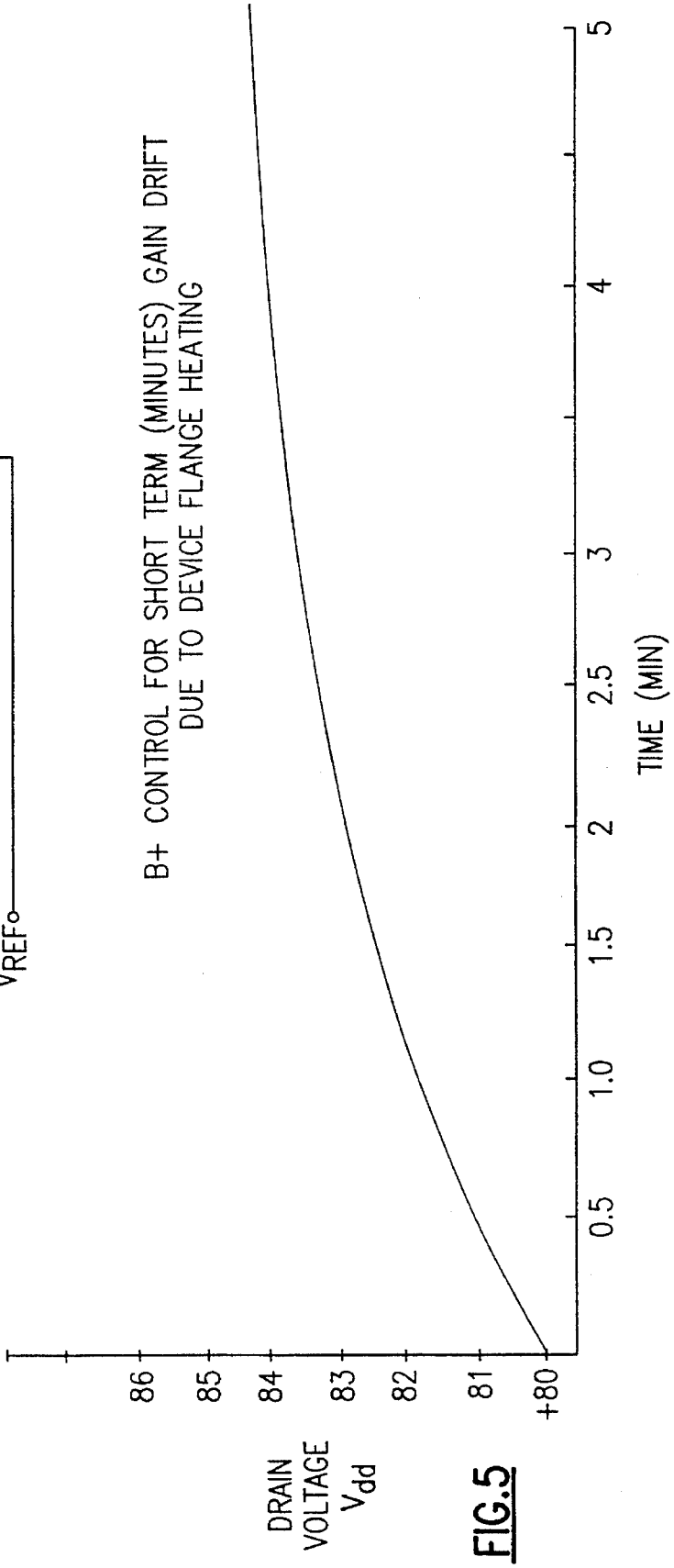
FIG. 5 is a chart showing adjustment of drain voltage over time to compensate for intermediate term, i.e., short term (minutes) gain degradation.

The circuit equivalent of this (FIG. 4) can employ a subtractive combiner 60 to which the temperature values $T_{HTSK}$ and $T_{AMB}$ are applied, and which feeds its difference output to an amplifier 62 of constant gain $K_1$. The power level from the directional coupler is integrated (34B), then fed to an amplifier 64 of gain $K_2$. The outputs of the amplifiers 62 and 64 are fed to additive inputs of a combiner 66, whose sum output is applied to an input of another combiner. The initial reference voltage $V_{REF}$ is supplied to another input of this combiner 66, which produces a corrected setpoint drain voltage $V_{dd}$. This circuit provides a corrected B+ voltage which rises over time according to the rise in flange temperature and in accordance with forward power. The output characteristic of this circuit is shown graphically in FIG. 5, here rising initially from about 80 volts and leveling off at about 85 volts after about five minutes. This curve is the inverse of the Curve 1 of FIG. 3, and thus compensates for the short term (minutes) gain drift due to device flange heating.

The sharp downward spike that is shown as Curve 2 (FIG. 3) is due solely to device die heating. This sharp spike of gain drift can be seen to drop rather sharply at first and then after several seconds merges with Curve 1. There is very little of this type of gain drift after about four seconds.

The sharp downward drift in gain is here referred to as short term (seconds) gain drift. This drift is a direct effect of the heating of the device die, caused by device dissipation during power transmission. The magnitude and time relationship is determined by the MOSFET die geometry and thermal inertia of the entire device. Along with these factors, the major contributing factor to the short term (seconds) gain drift is the mount of forward power transmitted by the entire amplifier 10.

The correction for this short term (seconds) gain drift will be referred to as "spike" gain stability correction. This correction is needed because of the very slow response time or B+ correction, because of the time constants involved in the system power supply 38. Linear power supplies are typically very slow, and could not respond to changes in output voltages where the required response time is in the tenths of seconds. Accordingly, it was necessary to look elsewhere to establish a correction technique with an adequately quick yet stable response.

In the technique of this invention, "spike" gain stability correction takes advantage of a stable and linear Class A power amplifier stage in advance of the amplifiers 28A, 28B. The embodiment of FIG. 1 employs the amplifier 26 for this purpose. This amplifier stage 26 has a very linear drain current to gain transfer characteristic. By merely increasing the gain of this linear stage at the same rate and a complementary magnitude to the short term (seconds) gain drift, the "spike" (i.e., Curve 2) of drift is corrected. This increase in gain is accomplished by an increase in the bias current through the amplifier 26, which will be proportional to an increase in its gate bias voltage $V_{GATE}$.

As discussed above, the major contributing variable to the short term (seconds) drift is the amount of output power, and correspondingly the "spike" gain stability correction is based on the amount of output power delivered by the system. Using a measurement already available in connection with the afore-mentioned B+ correction, the peak power transmitted is supplied from the directional coupler 34A, and this value is integrated 34B and sealed in sympathy with the shape of the downward spike of Curve 2. This integration provides a running time average of output power, and is converted to an increase in gate voltage $V_{GATE}$ that is applied to the Class A amplifier stage 26. The slight change in bias voltage $V_{GATE}$ causes a corresponding change in bias current, which produces an increase in the RF gain of the Class A amplifier stage 26.

Figure 6:
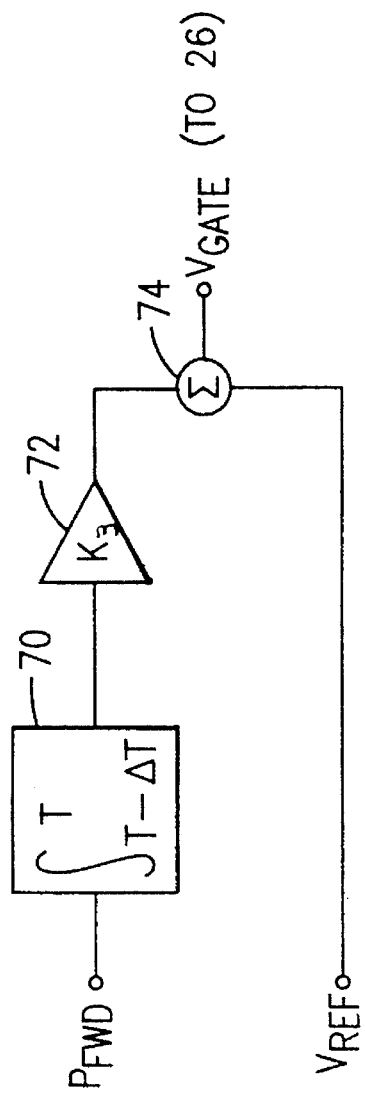
FIG. 6 is a simplified schematic diagram of gain control circuitry for adjusting gate voltage of a Class A preamplifier stage to compensate for short term, i.e., short-term (seconds) gain degradation.

This "spike" gain stability correction can be expressed in rather simple terms as follows:

$$V_{GATE} = V_{REF} + K_3[\int P_{FWD}(t)dt] \text{ (taken from } T - \Delta T \text{ to } T)$$

Where $V_{REF}$ is a reference voltage, $K_3$ is a scaling coefficient, and $\Delta T$ is a running interval, typically between about ten second and forty-five seconds, over which the output power is integrated. A simple block diagram of the circuitry for this correction is illustrated in FIG. 6, and can be realized either with discrete linear elements or as digital process within the contrtoller 40.

Figure 7:
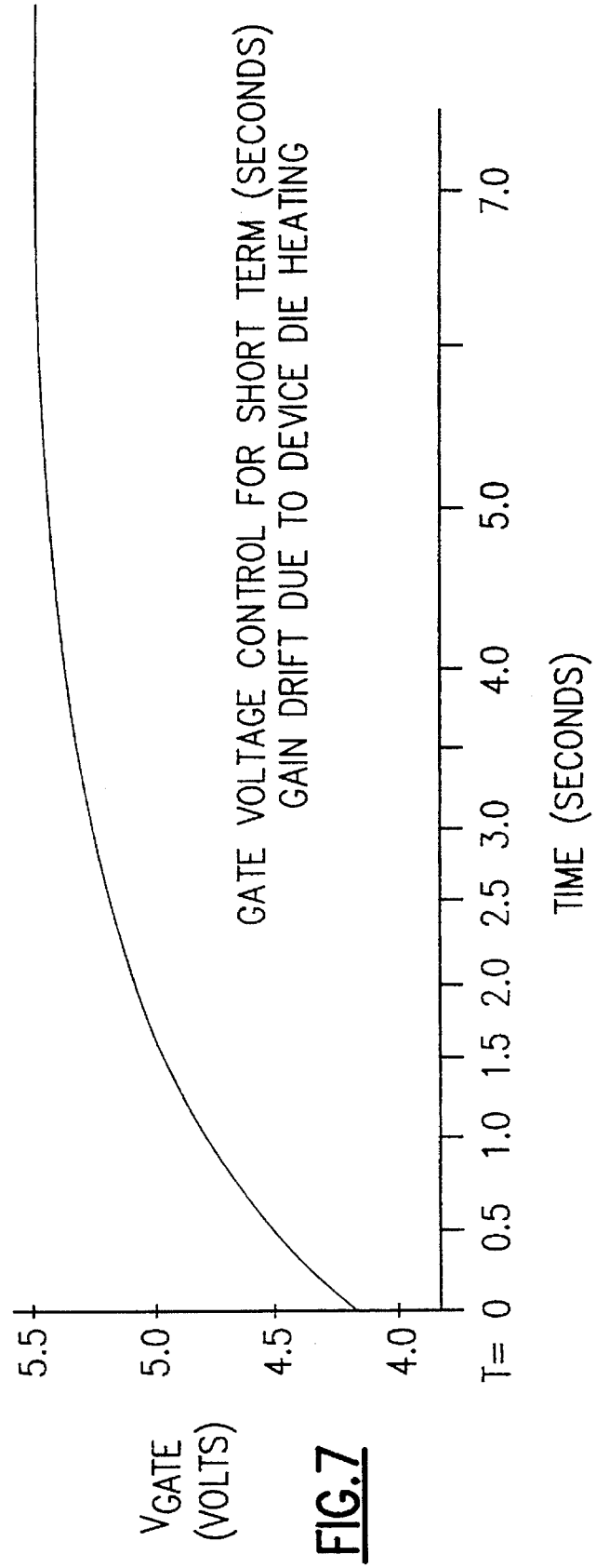
FIG. 7 is a chart showing adjustment of gate voltage over time to compensate for short term, i.e., short term (seconds) gain degradation.

The forward power $P_{FWD}$ is integrated in an integrator 70 over the period from $T - \Delta T$ to $T$, where $T$ is the current time. This integrated output is scaled in linear amplifier 72 and supplied to an additive combiner 74. The reference voltage $V_{REF}$ is applied to another input of the combiner 74, which thereby produces the corrected gate bias voltage $V_{GATE}$. This produces the compensated gate voltage $V_{GATE}$ as shown in the chart of FIG. 7. This correction responds quickly, i.e., within tenths of a second, to changes in output power, and provides a gain increase that is complementary to the short term (seconds) gain drift of Curve 2 of FIG. 3.

It can be seen that the B+ bias compensation adjusts to correct for the rather intermediate effects of the short term (minutes) gain drift, while the gate voltage $V_{GATE}$ compensation adjusts quickly for the short term (seconds) gain drift that is due to die heating. The combined effect is to compensate for both gain drift Curves 1 and 2, and yield an overall flat gain characteristic for the power amplifier system 10. This invention permits the effective use of high voltage MOSFETs, in place of RF power MOSFETs, while cancelling out the gain drift, which has been a major drawback.

While this invention has been described in detail with reference to a preferred embodiment, it should be recognized that the invention is not limited to that embodiment. Rather many modifications and variations will present themselves to persons skilled in the art without departure from the scope and spirit of the invention, as defined in the appended claims.

We claim:

1. A push-pull power amplifier that comprises:

a signal input;

linear preamplifier means coupled to said signal input and having an output;

an RF output circuit providing an amplified RF output signal;

a plurality of high-voltage field-effect transistors, each of which has a source-drain current path coupled to said RF output circuit, and each of which has a gate coupled to the output of said linear preamplifier means;

temperature sensor means in thermal communication with said transistors and having an output whose level varies in accordance with the temperature of said transistors;

short-term (minutes) gain stability compensation circuit means coupled to the output of said temperature sensor means and controlling a drain voltage in accordance with the output of said temperature sensor means; and short-term (seconds) gain stability compensation circuit means having an input coupled to said RF output circuit and coupled to control the gain of said linear preamplifier means to compensate for short term changes in the level of said RF output signal.

2. A push-pull power amplifier according to claim 1, wherein said linear preamplifier means includes a Class-A amplifier stage operated in a linear region.

3. A push-pull power amplifier according to claim 2, wherein said short-term (seconds) gain stability compensation circuit means includes means for controlling a gate bias voltage applied to said Class-A amplifier stage of said linear preamplifier means.

4. A push-pull power amplifier according to claim 1, wherein said short-term (seconds) gain stability compensation circuit means includes a directional coupler means connected to said RF output circuit means for producing a forward power level signal, integration means producing a time integral of said forward power level signal over a predetermined running time interval, and means producing a control signal based on said time integral for controlling the gain of said preamplifier.

5. A push-pull power amplifier according to claim 4, wherein said predetermined running time interval is on the order of ten seconds to forty-five seconds.

6. A push-pull power amplifier according to claim 5, wherein said predetermined running time interval is approximately thirty seconds.

7. A push-pull power amplifier according to claim 5, wherein said time integral is updated at intervals of approximately three seconds.

* * * * *